US012588156B2

(12) United States Patent
Kim

(10) Patent No.: US 12,588,156 B2
(45) Date of Patent: Mar. 24, 2026

(54) FOLDABLE DISPLAY APPARATUS INCLUDING A HINGE ASSEMBLY

(71) Applicant: LG Display Co., Ltd., Seoul (KR)

(72) Inventor: JunHyung Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/977,481

(22) Filed: Oct. 31, 2022

(65) Prior Publication Data

US 2023/0217615 A1 Jul. 6, 2023

(30) Foreign Application Priority Data

Dec. 31, 2021 (KR) ........................ 10-2021-0194333

(51) Int. Cl.
H05K 5/02 (2006.01)
F16C 11/04 (2006.01)
(52) U.S. Cl.
CPC ............ H05K 5/0226 (2013.01); F16C 11/04 (2013.01)
(58) Field of Classification Search
CPC ... H05K 5/0226; G06F 1/1681; G06F 1/1652; E05D 3/18
See application file for complete search history.

(56) References Cited

U.S. PATENT DOCUMENTS 9,173,287 B1 * 10/2015 Kim ...................... G06F 1/1652
9,798,359 B2 * 10/2017 Seo ........................ G06F 1/1652

10,664,021 B1 * 5/2020 Hsu ...................... H04B 1/3888
11,334,122 B2 * 5/2022 Hsu ........................ E05D 11/082
11,624,221 B1 * 4/2023 Hsu ........................ E05D 3/122
16/354
11,737,223 B2 * 8/2023 Lee ..................... H04M 1/0268
361/809

(Continued)

FOREIGN PATENT DOCUMENTS

CN 107505979 A 12/2017
CN 109308847 A 2/2019
(Continued)

OTHER PUBLICATIONS

Extended European Search Report dated May 10, 2023, issued in corresponding European Patent Application No. 22205262.3.
(Continued)

*Primary Examiner* — Rockshana D Chowdhury
*Assistant Examiner* — Douglas R Burtner
(74) *Attorney, Agent, or Firm* — Morgan, Lewis & Bockius LLP

(57) ABSTRACT

A foldable display apparatus may include: a housing frame including a first frame and a second frame; a hinge assembly coupled to the first frame and the second frame to implement a folding and unfolding movement of the first frame and the second frame; and a display panel disposed on the first frame and the second frame. The hinge assembly may include: a plurality of hinge arms each coupled to one of the first frame and the second frame; a hinge housing disposed below the plurality of hinge arms and accommodating the plurality of hinge arms; and an arm cover disposed above the plurality of hinge arms and fastened with the hinge housing, the arm cover including a plurality of recessed guide units respectively corresponding to the plurality of hinge arms.

20 Claims, 11 Drawing Sheets

(56)        References Cited

U.S. PATENT DOCUMENTS

| | | | |
|---|---|---|---|
| 12,105,559 B2 * | 10/2024 | Ou | G06F 1/1652 |
| 2015/0233162 A1 | 8/2015 | Lee et al. | |
| 2019/0033920 A1 | 1/2019 | Yun et al. | |
| 2020/0409429 A1 * | 12/2020 | Hsu | G06F 1/1681 |
| 2021/0034117 A1 * | 2/2021 | Torres | G06F 1/1616 |
| 2021/0103313 A1 * | 4/2021 | Soh | G06F 1/1656 |
| 2021/0181808 A1 * | 6/2021 | Liao | H04M 1/0216 |
| 2021/0318723 A1 * | 10/2021 | Cheng | H04M 1/022 |
| 2021/0355988 A1 * | 11/2021 | Cheng | G06F 1/1681 |
| 2023/0067187 A1 * | 3/2023 | Lin | F16C 11/04 |
| 2023/0185338 A1 * | 6/2023 | Seo | G06F 1/1652 |
| | | | 361/679.28 |
| 2023/0217616 A1 * | 7/2023 | Park | G06F 1/1641 |
| | | | 361/807 |
| 2023/0403347 A1 * | 12/2023 | Liu | H04M 1/022 |
| 2023/0409090 A1 * | 12/2023 | Hong | G06F 1/1616 |
| 2024/0206093 A1 * | 6/2024 | Liao | H05K 5/0226 |

FOREIGN PATENT DOCUMENTS

| | | | |
|---|---|---|---|
| EP | 3 723 351 A2 | 10/2020 | |
| KR | 10-2015-0096827 A | 8/2015 | |
| KR | 10-2021-0042214 A | 4/2021 | |

OTHER PUBLICATIONS

Office Action and Search Report dated Dec. 22, 2025, issued in Chinese Patent Application No. 202211509288.6 (with partial English translation). (Note—EP 3 723 351 A2, US 2020/0409429 A1, and US 2021/0034117 A1 cited in this CN Office Action have already been cited in a prior IDS.).

* cited by examiner

230

220a

220b

H

230     SS1

H

220a

SS2

220b

FOLDABLE DISPLAY APPARATUS INCLUDING A HINGE ASSEMBLY

CROSS-REFERENCE TO RELATED APPLICATIONS

This application claims the priority of Korean Patent Application No. 10-2021-0194333 filed on Dec. 31, 2021, in the Korean Intellectual Property Office, the disclosure of which is incorporated herein by reference.

BACKGROUND

Technical Field

The present disclosure relates to a foldable display apparatus and, more particularly, to a foldable display apparatus which has an inner-foldable hinge structure.

Description of the Related Art

Recently, mobile terminals, such as a wireless terminal, a personal digital assistant (PDA), a portable multimedia player (PMP), and an electronic notebook, are becoming smaller to ensure portability. However, since a user typically wants to receive various information, such as character information, videos, still images, MP3, or games, through a screen of the portable terminal, the user requires a large-sized or a wide-sized screen for the display unit. However, the reduction in the size of the portable terminal results in reduction in the size of the screen of the display unit, so that there are limitations for satisfying both requirements.

To overcome the above-mentioned limitations, recently, a flexible display device, such as a bendable display device or a foldable display device, is being developed.

The flexible display device may be implemented by configuring a substrate with a plastic material. When the flexible display device is folded, it is simply carried. When the flexible display device is unfolded, a large screen is implemented so that the flexible display device may be applied to various fields including not only mobile equipment, such as a mobile phone, an electronic book, or electronic newspaper, but also a television or a monitor.

SUMMARY

The inventors of the present disclosure invented a structure incorporating a hinge in an area where the display panel is folded, to implement a foldable display apparatus among flexible display devices. However, the inventors recognized that, in accordance with the recent increased demands for a large display size in the field of foldable display apparatuses, it was difficult to satisfy the desired rigidity of the large size foldable display apparatus with the hinge structure of the related art.

Accordingly, embodiments of the present disclosure are directed to a display device that substantially obviate one or more problems due to the limitations and disadvantages of the related art.

An object of the present disclosure is to provide a foldable display apparatus with an excellent durability by improving the rigidity of the hinge structure while simplifying the assembly structure.

Further, another object of the present disclosure is to provide a foldable display apparatus with an inner-foldable hinge structure which may ensure or improve the durability without increasing the thickness of the foldable display apparatus.

Further, still another object of the present disclosure is to provide a foldable display apparatus which applies a hinge structure for suppressing the reverse folding.

The features and aspects of the present disclosure are not limited to those mentioned above. Additional features and aspects will be set forth in part in the description that follows and in part will become apparent to those skilled in the art from the description or may be learned by practice of the inventive concepts provided herein. Other features and aspects of the inventive concepts may be realized and attained by the structure particularly pointed out in, or derivable from, the written description, the claims hereof, and the appended drawings.

To achieve these and other advantages and in accordance with the purpose of the disclosure, as embodied and broadly described herein, a foldable display apparatus may include: a housing frame including a first frame and a second frame; a hinge assembly coupled to the first frame and the second frame to implement a folding and unfolding movement of the first frame and the second frame; and a display panel disposed on the first frame and the second frame. The hinge assembly include: a plurality of hinge arms each coupled to one of the first frame and the second frame; a hinge housing disposed below the plurality of hinge arms and accommodating the plurality of hinge arms; and an arm cover disposed above the plurality of hinge arms and fastened with the hinge housing, the arm cover including a plurality of recessed guide units respectively corresponding to the plurality of hinge arms.

In another aspect of the present disclosure, a foldable display apparatus may include: a first frame and a second frame; a display panel connected to the first frame and the second frame; a hinge assembly rotatably connecting the first frame and the second frame to fold or unfold the display panel. The hinge assembly may include: a first hinge arm coupled to the first frame; a second hinge arm coupled to the second frame; a hinge housing below and accommodating the first hinge arm and the second hinge arm; and an arm cover above the first hinge arm and the second hinge arm and fastened to the hinge housing.

Other detailed matters of example embodiments are included in the detailed description and the drawings.

According to the present disclosure, the durability may be ensured or improved without increasing the thickness of the foldable display apparatus.

According to the present disclosure, the number of components of the foldable display apparatus may be minimized and a structure thereof may be simplified while the durability and the price competitiveness are improved.

The effects according to the present disclosure are not limited to the example effects described above, and various additional effects may be included in the present disclosure or may be achieved by the practice of the present disclosure.

It is to be understood that both the foregoing general description and the following detailed description of the present disclosure are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure. In the drawings.

DETAILED DESCRIPTION

Figure 1A:
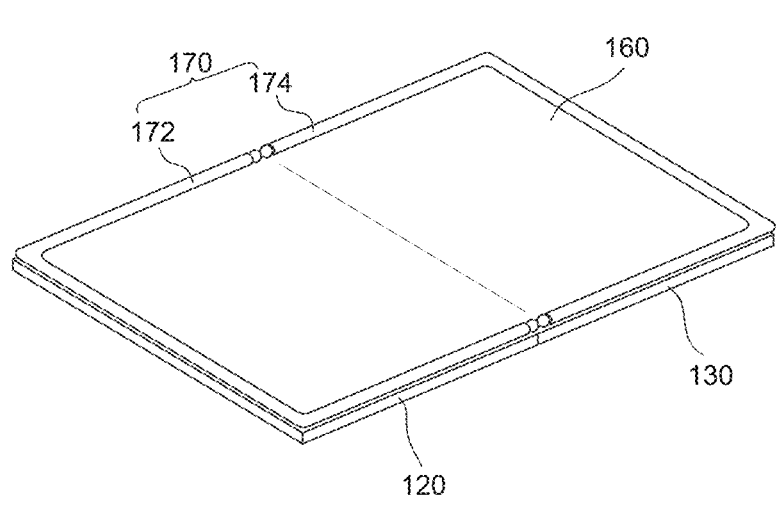
FIGS. 1A to 1C are perspective views of a foldable display apparatus according to an example embodiment of the present disclosure.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

The shapes, sizes, ratios, angles, numbers, and the like, which are illustrated in the drawings to describe various example embodiments of the present disclosure, are merely given by way of example. Therefore, the present disclosure is not limited to the illustrations in the drawings. Like reference numerals generally denote like elements throughout the specification, unless otherwise specified.

In the following description, where the detailed description of the relevant known function or configuration may unnecessarily obscure a feature or aspect of the present disclosure, a detailed description of such known function of configuration may be omitted.

Where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is to be construed as including an error or tolerance range even where no explicit description of such an error or tolerance range is provided.

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween.

Where an element or layer is referred to as being "on" or "connected to" another element or layer, it should be understood to mean that the element or layer may be directly on or directly connected to the other element or layer, or that intervening elements or layers may be present. Also, where one element is referred to as being disposed "on" or "under" another element, it should be understood to mean that the elements may be so disposed to directly contact each other, or may be so disposed without directly contacting each other.

Although the terms "first," "second," A, B, (a), (b), and the like may be used herein to describe various elements, these elements should not be interpreted to be limited by these terms as they are not used to define a particular order or precedence. These terms are used only to distinguish one element from another. For example, a first element could be termed a second element, and, similarly, a second element could be termed a first element, without departing from the scope of the present disclosure.

A size and a thickness of each component illustrated in the drawing are illustrated for convenience of description, and the present disclosure is not limited to the illustrated size and thickness of the component.

Features of various embodiments of the present disclosure may be partially or entirely coupled to or combined with each other. They may be linked and operated technically in various ways as those skilled in the art can sufficiently understand. The embodiments may be carried out independently of or in association with each other in various combinations.

Reference will now be made in detail to embodiments of the present disclosure, examples of which may be illustrated in the accompanying drawings.

FIGS. 1A to 1C and FIG. 2 are views for explaining a foldable display apparatus according to an example embodiment of the present disclosure.

Figure 1B:
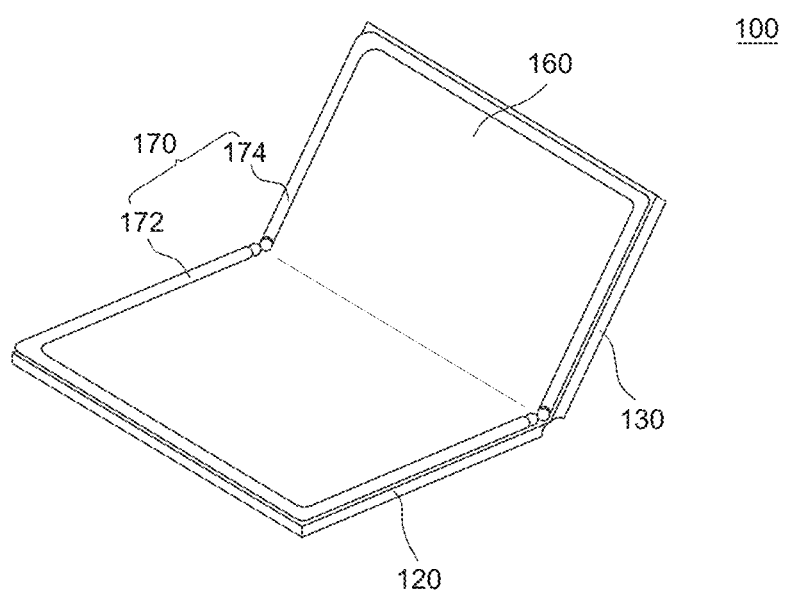
Figure 1C:
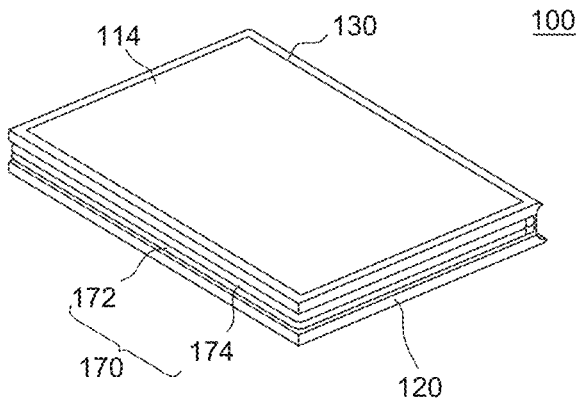
Figure 2:
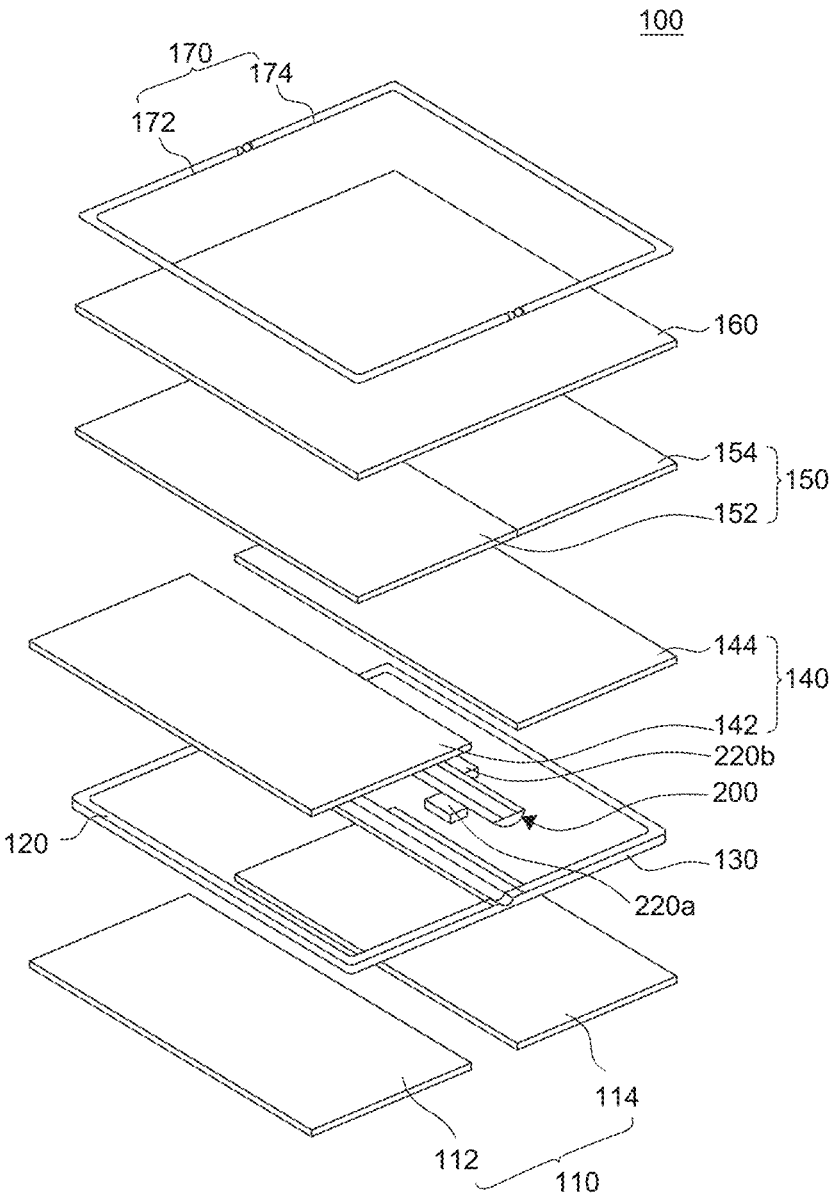
FIG. 2 is a schematic exploded perspective view of a foldable display apparatus according to an example embodiment of the present disclosure.

FIGS. 1A to 1C are perspective views of a display device according to an example embodiment of the present disclosure. FIG. 1A is a perspective view of a foldable display apparatus in an unfolded (stretched) state. FIG. 1B is a perspective view of the foldable display apparatus in a partially folded (bent) state. FIG. 1C is a perspective view of the foldable display apparatus in a fully folded (bent) state. FIG. 2 is a schematic exploded perspective view of a foldable display apparatus according to an example embodiment of the present disclosure.

When the foldable display apparatus 100 according to the example embodiment of the present disclosure is folded, an inner folding may be implemented so that the display panel is located inside the foldable display apparatus 100 in the folded state, but the present disclosure is not limited thereto.

As shown in FIGS. 1A to 1C and FIG. 2, the foldable display apparatus 100 according to the example embodiment of the present disclosure may include a housing cover 110, a housing frame (e.g., 120 and 130), a hinge assembly 200, a hardware module 140, a mid frame 150, a display panel 160, and a bezel cover 170.

In FIGS. 1A to 1C and FIG. 2, even though components of the foldable display apparatus 100 are generally illustrated without more details for the convenience of description, various additional components for driving the foldable display apparatus 100 may be further included.

The housing cover 110, which is a cover located at the bottom of the set, may be a base member for supporting various components of the foldable display apparatus 100 including the display panel 160. Further, the housing cover 110 may accommodate various components for driving the foldable display apparatus 100. The housing cover 110 may be configured by a first cover 112 at the left side and a second cover 114 at the right side, but is not limited thereto.

The first cover 112 and the second cover 114 may be disposed, respectively, in one area and the other area of the foldable display apparatus 100 where folding and unfolding may be performed. That is, the foldable display apparatus 100 according to the example embodiment of the present disclosure may be folded or unfolded at a boundary area between the first cover 112 and the second cover 114 by an external force applied by a user.

The first cover 112 and the second cover 114 may be provided with the same shape.

Hereinafter, a specific structure and function of a housing frame according to an example embodiment of the present disclosure will be described in detail with reference to FIG. 3.

Figure 3:
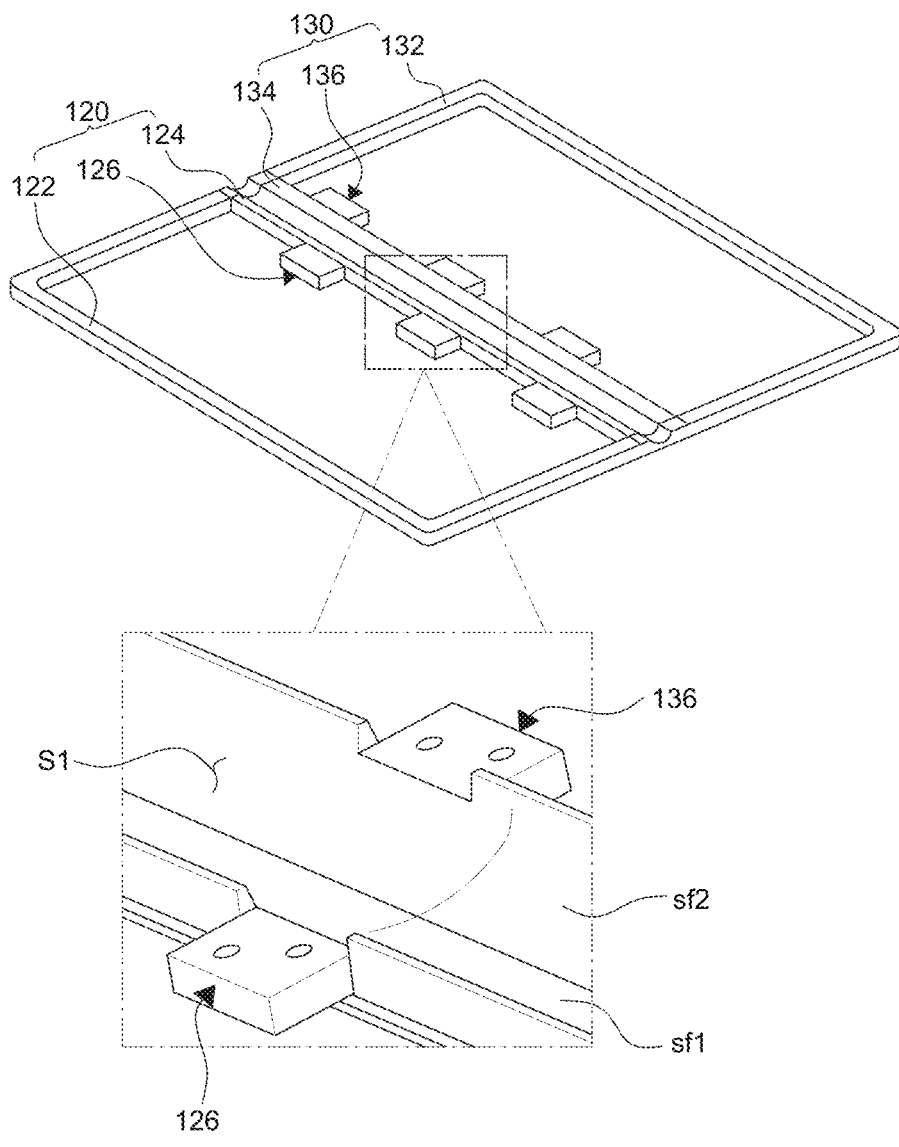
FIG. 3 is a perspective view of a housing frame of a foldable display apparatus according to an example embodiment of the present disclosure.

FIG. 3 is a perspective view of a housing frame of a foldable display apparatus 100 according to an example embodiment of the present disclosure.

The housing frames 120 and 130 may be external frames of a set to mount various hardware components of the foldable display apparatus 100 therein. The display panel 160 may be mounted in the housing frames.

The housing frames 120 and 130 may be configured by a first housing frame 120 at the left side and a second housing frame 130 at the right side, but are not limited thereto. The first housing frame 120 and the second housing frame 130 may be separately provided to be independently folded.

The first housing frame 120 and the second housing frame 130 may enclose the edges of the first cover 112 and the second cover 114, respectively, to fix the first cover 112 and the second cover 114. Further, the first housing frame 120 and the second housing frame 130 may enclose edges of a first module 142 and a second module 144, respectively, to fix the first module 142 and the second module 144 and may enclose edges of a first mid frame 152 and a second mid frame 154, respectively, to fix the first mid frame 152 and the second mid frame 154. Although not illustrated in the drawings, the first housing frame 120 and the second housing frame 130 may include fastening units to be coupled to the first cover 112 and the second cover 114, respectively.

The first housing frame 120 and the second housing frame 130 may each include an outer frame and an inner frame, respectively. The outer frame refers to a frame disposed on three surfaces exposed to the outside in an unfolded state of the foldable display apparatus 100. The inner frame refers to a frame located inside passing through the center of the foldable display apparatus 100 in the unfolded state. The first housing frame 120 may include a first outer frame 122 which encloses three edges of the first cover 112 and a first inner frame 124 which is in contact with the remaining edge of the first cover 112 located inside. The second housing frame 130 may include a second outer frame 132 which encloses three edges of the second cover 114 and a second inner frame 134 which is in contact with the remaining edge of the second cover 114 located inside. As shown in FIG. 3, the first inner frame 124 and the second inner frame 134 may be disposed to abut against each other in the unfolded state of the foldable display apparatus 100.

As illustrated in FIG. 3, the first inner frame 124 may include a first curved surface sf1 formed in a direction adjacent to the second inner frame 134, and the second inner frame 134 may include a second curved surface sf2 formed in a direction adjacent to the first inner frame 124. In the unfolded state of the foldable display apparatus 100, the first inner frame 124 and the second inner frame 134 may abut against each other so that the first curved surface sf1 of the first inner frame 124 and the second curved surface sf2 of the second inner frame 134 may form one accommodation space S1. The hinge assembly 200 to be described below may be seated in the accommodation space S1 formed by the first inner frame 124 and the second inner frame 134.

Further, the first housing frame 120 and the second housing frame 130 may include a first fastening unit 126 and a second fastening unit 136 coupled to the hinge assembly 200, respectively. The first fastening unit 126 may be formed in the first inner frame 124 of the first housing frame 120, and the second fastening unit 136 may be formed in the second inner frame 134 of the second housing frame 130. The first fastening unit 126 may be formed on the other side of the first curved surface sf1 of the first inner frame 124, that is, on a surface directed to the inside of the first housing frame 120 and away from the second housing frame 130. The second fastening unit 136 may be formed on the other side of the second curved surface sf2 of the second inner frame 134, that is, on a surface directed to the inside of the second housing frame 130 and away from the first housing frame 120. The first fastening unit 126 and the second fastening unit 136 may respectively be fastened with a first hinge arm 220a and a second hinge arm 220b of the hinge assembly 200 to be described below. The first fastening unit 126 and the second fastening unit 136 may be alternately disposed or staggered.

The first housing frame 120 and the second housing frame 130 according to the example embodiment of the present disclosure may be disposed in one area and the other area of the foldable display apparatus 100 where folding and unfolding may be performed. That is, the foldable display apparatus 100 may perform the folding and unfolding movement with respect to a boundary area between the first housing frame 120 and the second housing frame 130 by an external force applied by a user.

The hinge assembly 200 may be coupled to the housing frame to fold and unfold the foldable display apparatus 100.

The hinge arms 220a and 220b may couple the first fastening unit 126 of the first housing frame 120 and the second fastening unit 136 of the second housing frame 130 to each other. One or more hinge arms 220a and 220b of the hinge assembly 200 may be provided as needed. Even though FIG. 2 illustrates that hinge arms 220a and 220b are provided respectively at one side and the other side of the hinge assembly 200, the present disclosure is not limited thereto.

Specifically, a pair of hinge arms 220a and 220b may couple one side and the other side of the first fastening unit 126 and the second fastening unit 136, respectively.

As described above, the hinge assembly 200 may be disposed in a portion where the foldable display apparatus 100 may be folded and unfolded to allow the foldable display apparatus 100 to be folded and unfolded more easily. A specific structure and function of the hinge assembly 200 according to example embodiments of the present disclosure will be described below with reference to FIGS. 4A to 8B.

The hardware module 140 may be a module necessary to operate the display panel 160 of the foldable display apparatus 100 and may be disposed between the housing cover 110 and the mid frame 150 to be seated in the housing frame.

The hardware module 140 may be configured by a first module 142 at the left side and a second module 144 at the right side, but is not limited thereto. The first module 142 and the second module 144 may be separately provided to be independently folded. For example, the first module 142 may be a main board configured to transmit a signal to the display panel 160 or to receive a signal from the display panel 160 to control the display panel 160. Further, the second module 144 may be a battery for supplying a power to the display panel 160.

The mid frame 150 may be disposed opposite to the housing cover 110 to accommodate the hardware module 140 of the foldable display apparatus 100 located below the mid frame 150 and to support the display panel 160 located above the mid frame 150.

The mid frame 150 may be configured by a first mid frame 152 at the left side and a second mid frame 154 at the right side, but is not limited thereto. The first mid frame 152 and the second mid frame 154 may be separately provided to be independently folded.

The first mid frame 152 and the second mid frame 154 according to the example embodiment of the present disclosure may be disposed respectively in one area and the other area of the foldable display apparatus 100 where folding and unfolding may be performed. That is, the foldable display apparatus 100 may perform the folding and unfolding movement with respect to a boundary area between the first mid frame 152 and the second mid frame 154 by an external force applied by a user.

The display panel 160 may be disposed on an upper surface of the mid frame 150. The display panel 160 may use any one of various display panels 160, such as an organic light emitting display panel or a liquid crystal display panel.

Although not illustrated in the drawings, the display panel 160 is configured to display images to the user and may include a plurality of sub pixels. In the display panel 160, the plurality of scan lines and the plurality of data lines may intersect each other, and each of the plurality of sub pixels may be connected to a corresponding one of the scan lines and a corresponding one of the data lines. In addition, each of the plurality of sub pixels may be connected to the high potential power line, the low potential power line, the initialization signal line, and the emission control signal line.

The sub pixel is a minimum unit which configures a display screen, and each of the plurality of sub pixels may include a light emitting diode and a driving circuit for driving the light emitting diode. The plurality of light emitting diodes may be defined in different ways depending on a type of the display panel 160. For example, if the display panel 160 is an organic light emitting display panel 160, the light emitting diode may be an organic light emitting diode which includes an anode, a light emitting unit, and a cathode. Hereinafter, even though the description will be made under the assumption that the light emitting diode is an organic light emitting diode, the type of the light emitting diode is not limited thereto.

A pixel circuit is a circuit for controlling the driving of the light emitting diode. For example, the pixel circuit may be configured to include a plurality of transistors and a capacitor, but is not limited thereto.

Further, the display panel 160 may have flexibility so as to be folded and unfolded in accordance with the folding and unfolding of the foldable display apparatus 100.

The foldable display apparatus 100 may be folded such that the first housing frame 120 and the second housing frame 130 form a specific folding angle. For example, as illustrated in FIG. 1A, the first housing frame 120 and the second housing frame 130 may be fully unfolded with an angle of 180°. In contrast, as illustrated in FIG. 1B, the foldable display apparatus 100 may be partially folded at a specific angle. In this case, the display panel 160 disposed above the first housing frame 120 and the second housing frame 130 may also folded at a specific angle together with the folding of the first housing frame 120 and the second housing frame 130. Moreover, as illustrated in FIG. 1C, the foldable display apparatus 100 may be fully folded such that the first housing frame 120 and the second housing frame 130 may face and overlap each other and abut against each other.

Further, the foldable display apparatus 100 may maintain a specific folding angle by the holding force supplied from the hinge assembly 200. That is, the first housing frame 120 and the second housing frame 130 may be fixed while maintaining a specific folding angle by the hinge assembly 200. Therefore, the foldable display apparatus 100 may be folded at a specific angle as intended by the user and may maintain a folded state at the specific angle by the holding force of the hinge.

The bezel cover 170 may cover an upper bezel of the display panel 160 on the upper surface of the display panel 160.

The bezel cover 170 may be configured by a first bezel cover 172 at the left side and a second bezel cover 174 at the right side, but is not limited thereto.

Hereinafter, the specific structure and function of the hinge assembly 200 according to example embodiments of the present disclosure will be described in detail with reference to FIGS. 4A, 4B, 5A, 5B, and 6A to 6C.

Figure 4A:
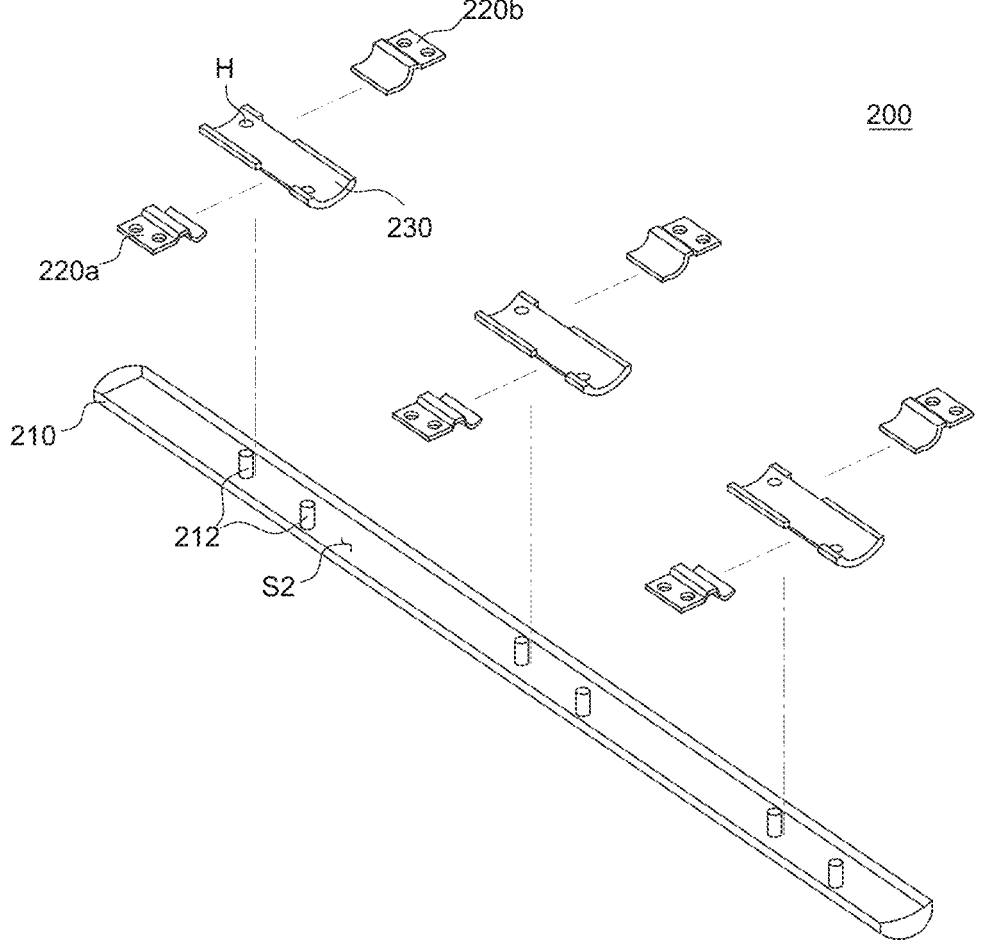
FIG. 4A is a schematic exploded perspective view of a hinge assembly of a foldable display apparatus according to an example embodiment of the present disclosure.
Figure 4B:
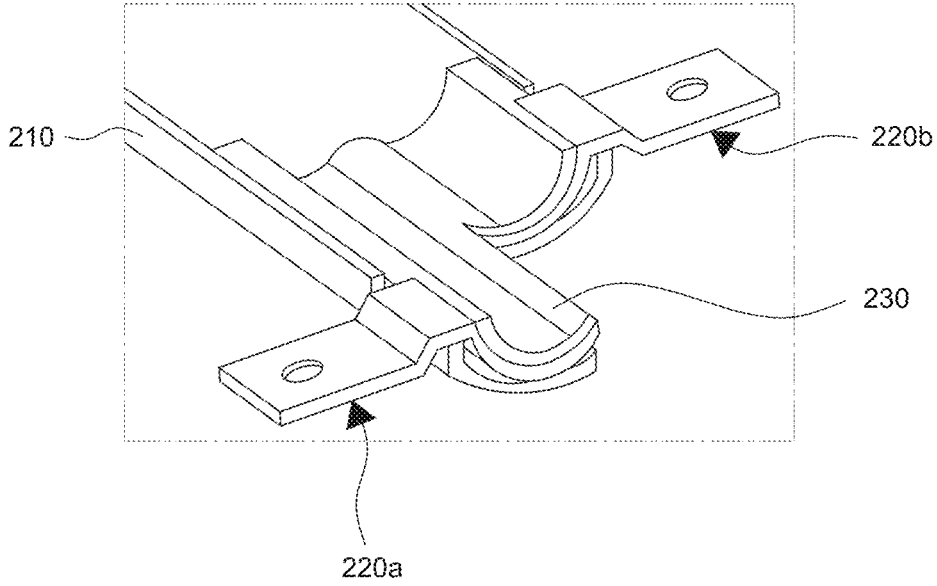
FIG. 4B is a schematic sectional perspective view of a hinge assembly of a foldable display apparatus according to an example embodiment of the present disclosure.
Figure 5A:
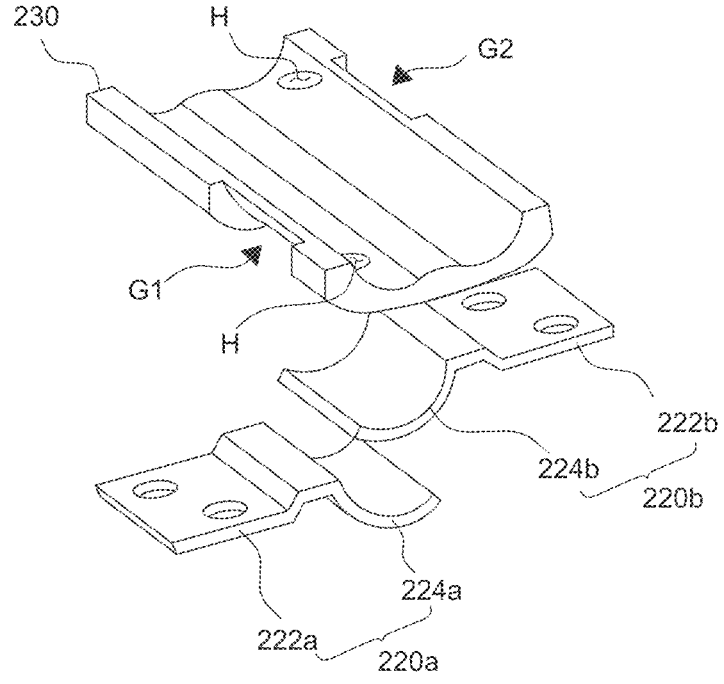
FIGS. 5A and 5B are schematic exploded perspective views of some components of a hinge assembly of a foldable display apparatus according to an example embodiment of the present disclosure.
Figure 5B:
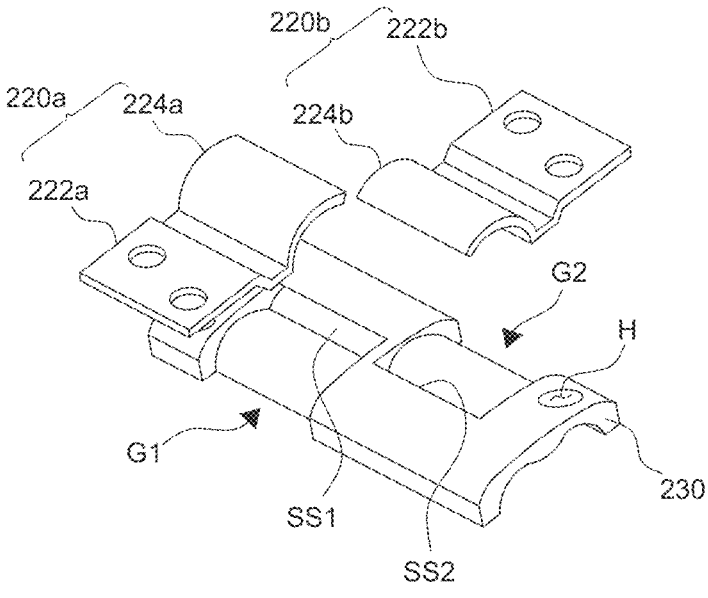
Figure 6A:
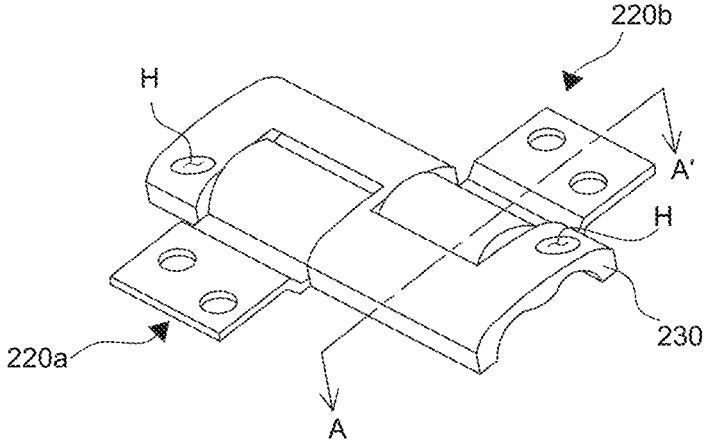
FIG. 6A is a schematic perspective view of some components of a hinge assembly of a foldable display apparatus according to an example embodiment of the present disclosure.
Figure 6B:
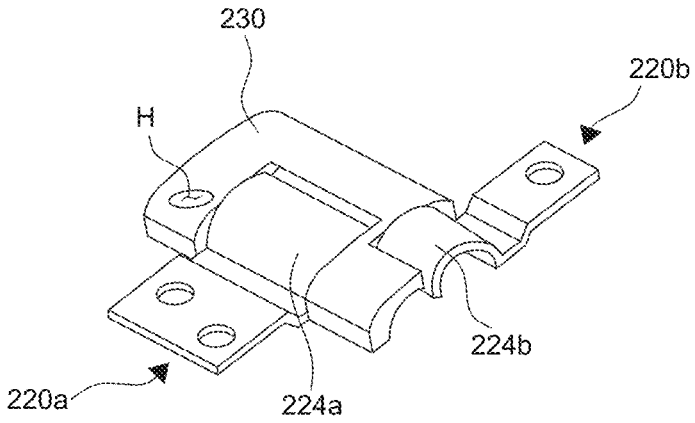
FIG. 6B is a sectional perspective view taken along the line A-A' of FIG. 6A.
Figure 6C:
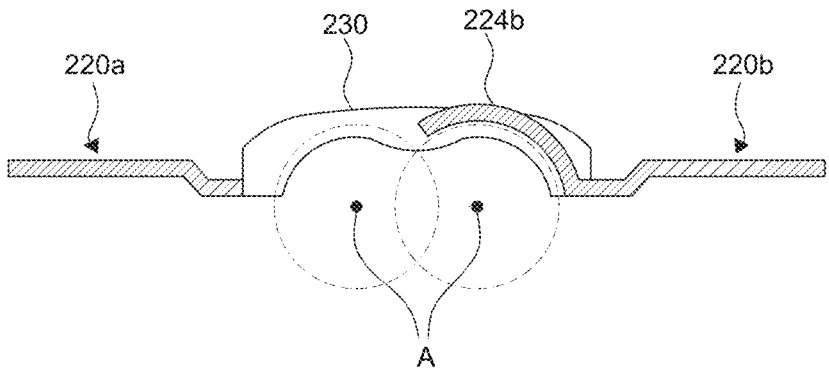
FIG. 6C is a cross-sectional view taken along A-A' of FIG. 6A.

FIG. 4A is a schematic exploded perspective view of a hinge assembly 200 of a foldable display apparatus 100 according to an example embodiment of the present disclosure. FIG. 4B is a schematic sectional perspective view of a hinge assembly 200 of a foldable display apparatus 100 according to an example embodiment of the present disclosure. FIGS. 5A and 5B are schematic exploded perspective views of some components of a hinge assembly 200 of a foldable display apparatus 100 according to an example embodiment of the present disclosure. FIG. 6A is a schematic perspective view of some configurations of a hinge assembly 200 of a foldable display apparatus 100 according to an example embodiment of the present disclosure. FIG. 6B is a sectional perspective view taken along the line A-A' of FIG. 6A. FIG. 6C is a cross-sectional view taken along A-A' of FIG. 6A.

As shown in FIGS. 4A and 4B, the hinge assembly 200 of the foldable display apparatus 100 according to the example embodiment of the present disclosure may be configured by a hinge housing 210, hinge arms 220a and 220b, and an arm cover 230.

The hinge housing 210 is an external cover of the hinge assembly 200 and may have a predetermined length. The hinge housing 210 may accommodate the hinge arms 220*a* and 220*b* and the arm cover 230 located thereabove.

The hinge housing 210 may have a predetermined accommodation space S2 and may have a semi-cylindrical shape with a concave upper surface. Accordingly, the hinge arms 220*a* and 220*b* and the arm cover 230 may be accommodated in the accommodation space S2 of the hinge housing 210.

The hinge housing 210 may include one or more fixing members 212 to fix the arm cover 230. The fixing member(s) 212 may have a shape protruding from the upper surface of the hinge housing 210 in a direction toward the arm cover 230. Here, the fixing member(s) 212 may be fastened with fixing groove(s) H formed on the arm cover 230. The fixing member(s) 212 may be fastened with the fixing groove(s) of the arm cover 230 by means of a fastening member, such as a screw.

As illustrated in FIGS. 2 and 3, the hinge housing 210 may be disposed such that the rear surface faces the housing frames 120 and 130 and the upper surface faces the mid frame 150. Here, the rear surface of the hinge housing 210 may be disposed to face the accommodation space S1 of the housing frame formed by the first housing frame 120 and the second housing frame 130 abutting against each other. That is, the hinge housing 210 may be disposed so that at least a part thereof is seated in the accommodation space S1 of the housing frame.

The hinge arms 220*a* and 220*b* may couple the hinge assembly 200 and the housing frame to each other to allow folding and unfolding of the housing frame with respect to the hinge assembly 200.

A plurality of hinge arms 220*a* and 220*b* may be configured. Specifically, as illustrated in FIG. 4A, three sets of hinge arms 220*a* and 220*b* may be provided at one side and the other side of the hinge assembly 200, respectively. The hinge arms 220*a* and 220*b* may be configured by first hinge arms 220*a* at the left side and second hinge arms 220*b* at a right side, but are not limited thereto. A plurality of first hinge arms 220*a* and a plurality of second hinge arms 220*b* may be configured. Accordingly, the plurality of first hinge arms 220*a* may be disposed at the left side of the hinge housing 210, and the plurality of second hinge arms 220*b* may be disposed at the right side of the hinge housing. A pair of first hinge arm 220*a* and second hinge arm 220*b* may be alternately disposed or staggered and be adjacent to each other.

The hinge arms 220*a* and 220*b* may include fixing units 222*a* and 222*b* which are coupled respectively to the fastening units 126 and 136 of the housing frame. The hinge arms 220*a* and 220*b* may also respectively include rotary units 224*a* and 224*b*, which may rotatably move between the hinge housing 210 and the arm cover 230. Specifically, the first hinge arm 220*a* may include a first fixing unit 222*a* coupled to the first fastening unit 126 of the first housing frame 120, and the second hinge arm 220*b* may include a second fixing unit 222*b* coupled to the second fastening unit 136 of the second housing unit 130. The fixing units of the hinge arms 220*a* and 220*b* may couple the hinge assembly 220 to the housing frame to allow folding and unfolding of the housing frame and other components accommodated in the housing frame in accordance with the movement of the hinge assembly 200.

As shown in FIGS. 5A and 5B, the rotary units 224*a* and 224*b* may have a curved shape to have an arc corresponding to the accommodation space S2 of the hinge housing 210.

Further, the rotary units 224*a* and 224*b* may have a curved shape to have an arc corresponding to the guide units G1 and G2 of the arm cover 230, respectively. The first hinge arm 220*a* may include a first rotary unit 224*a* corresponding to a first guide unit G1 of the arm cover 230, and the second hinge arm 220*b* may include a second rotary unit 224*b* corresponding to a second guide unit G2 of the arm cover 230.

The first rotary unit 224*a* of the first hinge arm 220*a* and the second rotary unit 224*b* of the second hinge arm 220*b* may be alternately disposed or staggered.

As illustrated in FIG. 6C, the first rotary unit 224*a* and the second rotary unit 224*b* may each form a predetermined arc with respect to a corresponding one of a pair of rotary axes A. Accordingly, during a folding or unfolding movement of the foldable display apparatus 100, the first rotary unit 224*a* and the second rotary unit 224*b* may rotate respectively around the pair of rotary axes A so that the first hinge arm 220*a* and the second hinge arm 220*b* rotate together.

The arm cover 230 may be an external cover of the hinge assembly 200 to be disposed to face the hinge housing 210. The arm cover 230 may be disposed above the hinge arms 220*a* and 220*b* to guide a rotary motion of the hinge arms 220*a* and 220*b*.

The arm cover 230 may have a predetermined length to cover the hinge arms 220*a* and 220*b*. As illustrated in FIGS. 4A and 5A, the arm cover 230 may have multiple sections each covering one first hinge arm 220*a* and one second hinge arm 220*b*, but is not limited thereto. For example, the arm cover 230 may have a structure extending so as to cover the plurality of first hinge arms 220*a* and the plurality of second hinge arms 220*b* and may have a length corresponding to the hinge housing 210 located therebelow.

The arm cover 230 may have a structure with a concave upper surface. Unlike the hinge housing 210 with a semi-cylindrical shape having one central axis, an upper surface of the arm cover 230 may have two central axes to have two cylindrical surfaces.

The arm cover 230 may have one or more fixing grooves H to be fixed to the hinge housing 210. As illustrated in FIG. 4A, the fixing groove(s) H may be formed in the arm cover 230 so as to be aligned with the fixing member(s) 212 of the hinge housing 210.

The arm cover 230 may include recessed guide units G1 and G2 to accommodate the rotary units 224*a* and 224*b* of the hinge arms 220*a* and 220*b* and to rotatably move the rotary units 224*a* and 224*b*. The guide units G1 and G2 may have a structure partially recessed from the rear surface of the arm cover 230 so as to have an arc corresponding to the rotary units 224*a* and 224*b* of the hinge arms 220*a* and 220*b*. Therefore, the rotary units 224*a* and 224*b* of the hinge arms 220*a* and 220*b* may be disposed between the hinge housing 210 and the arm cover 230 and may be accommodated respectively in the guide units G1 and G2 of the arm cover 230.

Hereinafter, a structure and movement of the hinge arms 220*a* and 220*b* and the arm cover 230 when the foldable display apparatus 100 is folded and unfolded will be described in detail with reference to FIGS. 7A, 7B, 8A, and 8B.

Figure 7A:
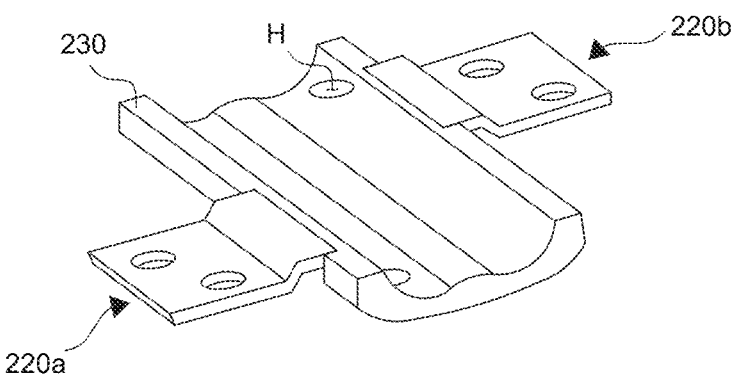
FIGS. 7A and 7B are schematic perspective views of some components of a hinge assembly of a foldable display apparatus according to an example embodiment of the present disclosure in an unfolded state.
Figure 7B:
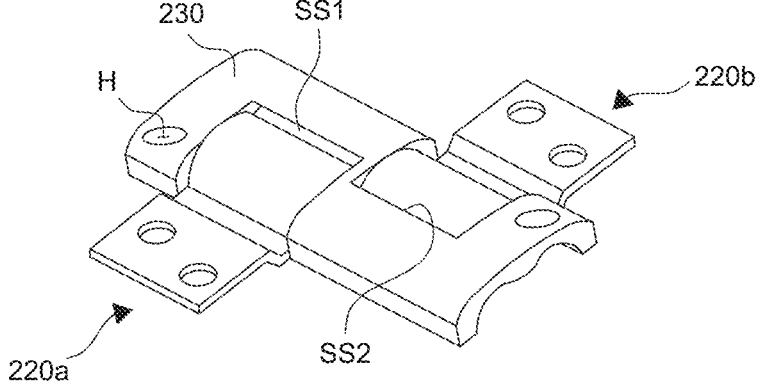
Figure 8A:
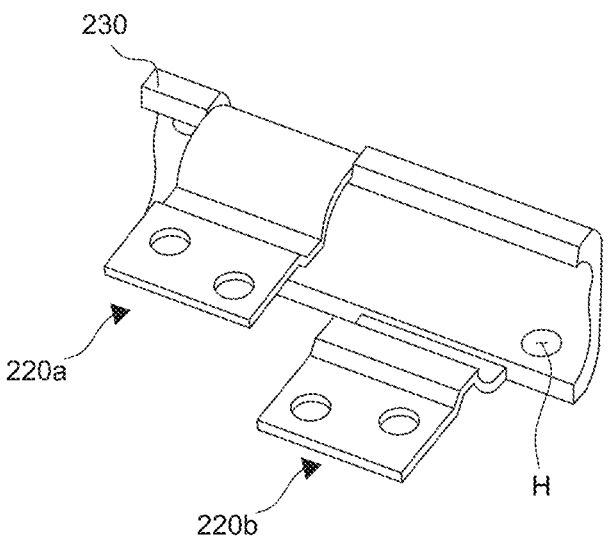
FIGS. 8A and 8B are schematic perspective views of some components of a hinge assembly of a foldable display apparatus according to an example embodiment of the present disclosure in a folded state.
Figure 8B:
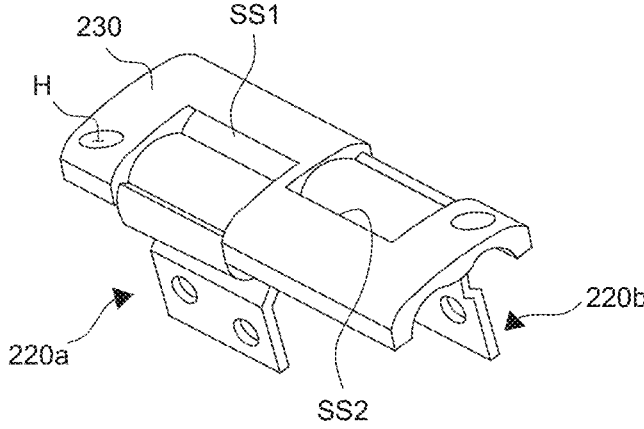

FIGS. 7A and 7B are schematic perspective views of some components of a hinge assembly 200 of a foldable display apparatus 100 according to an example embodiment of the present disclosure in an unfolded state. FIGS. 8A and 8B are schematic perspective views of some components of a hinge assembly 200 of a foldable display apparatus 100 according to an example embodiment of the present disclosure in a folded state. FIGS. 7A and 8A are views seen from the top, and FIGS. 7B and 8B are views seen from the bottom.

As illustrated in FIGS. 5A, 5B, 7A, and 7B, the hinge arms 220*a* and 220*b* may be disposed to correspond respectively to the guide units G1 and G2 of the hinge cover 230. Specifically, the first hinge arm 220*a* may be disposed below the first guide unit G1 of the hinge cover, and the second hinge arm 220*b* may be disposed below the second guide unit G2. Here, one end of the first rotary unit 224*a* of the first hinge arm 220*a* may be disposed to abut against a step portion S S1 of the first guide unit G1, and one end of the second rotary unit 224*b* of the second hinge arm 220*b* may be disposed to abut against a step portion SS2 of the second guide unit G2. The ends of the first rotary unit 224*a* and the second rotary unit 224*b* may be disposed to be in contact with the step portions SS1 and SS2, respectively, to suppress the outer-folding of the display panel 160.

As illustrated in FIGS. 8A and 8B, during the folding, the rotary units of the hinge arms 220*a* and 220*b* may rotate respectively along the guide units G1 and G2 of the hinge cover 230. That is, an inner surface of the first rotary unit 224*a* of the first hinge arm 220*a* may move along the first guide unit G1 while being in contact with one surface of the first guide unit G1 of the hinge cover 230. By doing this, in the foldable display apparatus 100, the first hinge arm 220*a* and the second hinge arm 220*b* may be inwardly folded.

The first hinge arm 220*a* and the second hinge arm 220*b* may rotatably move respectively along the first guide unit G1 and the second guide unit G2 independently from each other to allow biaxial folding. That is, the first hinge arm 220*a* may rotate around one rotary axis A defined by the first guide unit G1, and the second hinge arm 220*b* may rotate around another rotary axis A defined by the second guide unit G2.

The foldable display apparatus according to example embodiments of the present disclosure may use a hinge assembly configured by a hinge housing, a hinge arm, and an arm cover to provide a biaxially foldable display apparatus while minimizing the number of components. The components and the structure are simplified to improve the price competitiveness of the foldable display apparatus. Further, the foldable display apparatus according to example embodiments of the present disclosure may suppress the reverse folding by means of the housing frame structure accommodating the hinge assembly and may improve the rigidity at both sides to ensure the durability.

The example embodiments of the present disclosure can also be described as follows:

According to an aspect of the present disclosure, a foldable display apparatus may include: a housing frame including a first frame and a second frame; a hinge assembly coupled to the first frame and the second frame to implement a folding and unfolding movement of the first frame and the second frame; and a display panel disposed on the first frame and the second frame. The hinge assembly may include: a plurality of hinge arms each coupled to one of the first frame and the second frame; a hinge housing disposed below the plurality of hinge arms and accommodating the plurality of hinge arms; and an arm cover disposed above the plurality of hinge arms and fastened with the hinge housing, the arm cover including a plurality of recessed guide units respectively corresponding to the plurality of hinge arms.

In some embodiments, each of the plurality of hinge arms may include: a fixing unit coupled to the housing frame; and a rotary unit having a curved shape to rotatably move between the hinge housing and the arm cover.

In some embodiments, the hinge housing may have a semicylindrical shape with a predetermined accommodation space, and the arm cover may have an upper surface including two cylindrical surfaces with two central axes.

In some embodiments, each of the guide units may have a shape recessed from a lower surface of the arm cover to accommodate at least a part of a corresponding one of the hinge arms, and a lower surface of the guide unit may have an arc shape.

In some embodiments, the plurality of hinge arms may include a first hinge arm disposed at one side of the hinge housing and a second hinge arm disposed at the other side of the hinge housing, the first hinge arm and the second hinge arm being adjacent to each other and being staggered.

In some embodiments, the foldable display apparatus may further include: a first cover and a second cover disposed below the display panel. The first frame and the second frame may respectively include a first inner frame enclosing an inner side of the first cover and a second inner frame enclosing an inner side of the second cover. The first inner frame and the second inner frame may be in contact with each other in an unfolded state of the foldable display apparatus.

In some embodiments, the first inner frame may include a first curved surface adjacent to the second inner frame, the second inner frame may include a second curved surface adjacent to the first inner frame. In the unfolded state of the foldable display apparatus, the first curved surface and the second curved surface may form an accommodation space, and the hinge assembly may be disposed in the accommodation space.

In some embodiments, the first frame may include a first fastening unit formed in the first inner frame, the second frame may include a second fastening unit formed in the second inner frame, and the first fastening unit may be coupled to a first fixing unit of the first hinge arm, and the second fastening unit may be coupled to a second fixing unit of the second hinge arm.

In some embodiments, the foldable display apparatus may further include: a main board module and a battery module disposed on the first cover and the second cover, respectively; a first mid frame and a second mid frame disposed on the main board module and the battery module, respectively; and a first bezel cover and a second bezel cover covering an upper edge of the display panel. The first frame and the second frame may enclose the main board module and the battery module.

In some embodiments, the plurality of guide units may include a first guide unit corresponding to a first rotary unit of the first hinge arm and a second guide unit corresponding to a second rotary unit of the second hinge arm, and the first rotary unit and the second rotary unit may rotate around a pair of different rotary axes defined by the first guide unit and the second guide unit, respectively.

In another aspect of the present disclosure, a foldable display apparatus may include: a first frame and a second frame; a display panel connected to the first frame and the second frame; a hinge assembly rotatably connecting the first frame and the second frame to fold or unfold the display panel. The hinge assembly may include: a first hinge arm coupled to the first frame; a second hinge arm coupled to the second frame; a hinge housing below and accommodating the first hinge arm and the second hinge arm; and an arm cover above the first hinge arm and the second hinge arm and fastened to the hinge housing.

In some embodiments, the arm cover may include: a first recessed guide and a second recessed guide on a lower surface facing the first hinge arm and the second hinge arm, wherein the first recessed guide and the second recessed guide may each have an arc shape.

In some embodiments, each of the first hinge arm and the second hinge arm may include: a fixing unit coupled to a corresponding one of the first frame and the second frame; and a rotary unit having a curved shape to rotatably move along a corresponding one of the first recessed guide and the second recessed guide of the arm cover.

In some embodiments, the curved shape of the rotary unit may correspond with the arc shape of the corresponding one of the first recessed guide and the second recessed guide of the arm cover, and the rotary unit of the first hinge arm may rotate with respect to a rotary axis different from a rotary axis with respect to which the rotary unit of the second hinge arm rotates.

In some embodiments, the hinge assembly may be configured to fold the display panel inwardly so that the display panel is positioned in an interior of the foldable display apparatus in a folded state.

In some embodiments, the first recess guide and the second recess guide of the arm cover may each include a step portion to stop the first hinge arm and the second hinge arm, respectively, from rotating to fold the display panel outwardly.

In some embodiments, the foldable display apparatus may further include: a first cover and a second cover disposed below the display panel. The first frame and the second frame may respectively include a first inner frame enclosing an inner side of the first cover and a second inner frame enclosing an inner side of the second cover. The first inner frame and the second inner frame may be in contact with each other in an unfolded state of the foldable display apparatus.

In some embodiments, the first inner frame may include a first curved surface adjacent to the second inner frame, the second inner frame may include a second curved surface adjacent to the first inner frame. In the unfolded state of the foldable display apparatus, the first curved surface and the second curved surface may form an accommodation space, and the hinge assembly may be disposed in the accommodation space.

In some embodiments, the first frame may include a first fastening unit formed in the first inner frame, the second frame may include a second fastening unit formed in the second inner frame, and the first fastening unit may be coupled to a first fixing unit of the first hinge arm, and the second fastening unit may be coupled to a second fixing unit of the second hinge arm.

In some embodiments, the foldable display apparatus may further include: a main board module and a battery module disposed on the first cover and the second cover, respectively; a first mid frame and a second mid frame disposed on the main board module and the battery module, respectively; and a first bezel cover and a second bezel cover covering an upper edge of the display panel, wherein the first frame and the second frame may enclose the main board module and the battery module.

In some embodiments, the hinge housing may include a fixing member, and the arm cover may be fastened with the hinge housing by the fixing member and a fixing groove formed on the arm cover Although example embodiments of the present disclosure have been described in detail with reference to the accompanying drawings, the present disclosure is not limited thereto and may be embodied in many different forms without departing from the technical concept of the present disclosure. Therefore, example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

It will be apparent to those skilled in the art that various modifications and variations can be made in the present disclosure without departing from the technical idea or scope of the disclosures. Thus, it is intended that embodiments of the present disclosure cover the modifications and variations of the disclosure provided they come within the scope of the appended claims and their equivalents.

What is claimed is:

1. A foldable display apparatus, comprising:
a housing frame including a first frame and a second frame;
a hinge assembly coupled to the first frame and the second frame to implement a folding and unfolding movement of the first frame and the second frame; and
a display panel disposed on the first frame and the second frame,
wherein the hinge assembly includes:
a plurality of hinge arms each coupled to one of the first frame and the second frame;
a hinge housing disposed below the plurality of hinge arms and accommodating the plurality of hinge arms; and
an arm cover disposed above the plurality of hinge arms and fastened with the hinge housing, the arm cover including a plurality of guide units each having a shape recessed from a lower surface of the arm cover in an upward direction and respectively corresponding to the plurality of hinge arms to accommodate at least a part of a corresponding one of the hinge arms in the recessed shape and contact an upper surface of the corresponding one of the hinge arms,
wherein a lower surface of each of the guide units has an arc shape and faces toward the hinge housing, the arc shape being convex in a downward direction,
wherein both ends of each of the hinge arms are configured to rotate upwardly in a folding movement, such that the hinge assembly is configured to fold the display panel inwardly so that the display panel is positioned in an interior of the foldable display apparatus in a folded state, and
wherein each of the guide units of the arm cover includes a step portion to stop the corresponding one of the hinge arms from rotating to fold the display panel outwardly.

2. The foldable display apparatus according to claim 1, wherein each of the plurality of hinge arms includes:
a fixing unit coupled to the housing frame; and
a rotary unit having a curved shape to rotatably move between the hinge housing and the arm cover along the recessed shape of a corresponding one of the guide units.

3. The foldable display apparatus according to claim 1, wherein:

the hinge housing has a semicylindrical shape with a predetermined accommodation space, and the arm cover has a concave upper surface including two connected cylindrical surfaces whose respective central axes are spaced apart from each other.

4. The foldable display apparatus according to claim 1, wherein the plurality of hinge arms includes a first hinge arm disposed at one side of the hinge housing and a second hinge arm disposed at the other side of the hinge housing, the first hinge arm and the second hinge arm being adjacent to each other and being staggered.

5. The foldable display apparatus according to claim 4, further comprising:

a first cover and a second cover disposed below the display panel, wherein the first frame and the second frame respectively include a first inner frame enclosing an inner side of the first cover and a second inner frame enclosing an inner side of the second cover, and wherein the first inner frame and the second inner frame are in contact with each other in an unfolded state of the foldable display apparatus.

6. The foldable display apparatus according to claim 5, wherein:

the first inner frame includes a first curved surface adjacent to the second inner frame, the second inner frame includes a second curved surface adjacent to the first inner frame, in the unfolded state of the foldable display apparatus, the first curved surface and the second curved surface form an accommodation space, and the hinge assembly is disposed in the accommodation space.

7. The foldable display apparatus according to claim 5, wherein:

the first frame includes a first fastening unit formed in the first inner frame, the second frame includes a second fastening unit formed in the second inner frame, and the first fastening unit is coupled to a first fixing unit of the first hinge arm, and the second fastening unit is coupled to a second fixing unit of the second hinge arm.

8. The foldable display apparatus according to claim 5, further comprising:

a main board module and a battery module disposed on the first cover and the second cover, respectively;

a first mid frame and a second mid frame disposed on the main board module and the battery module, respectively; and a first bezel cover and a second bezel cover covering an upper edge of the display panel, wherein the first frame and the second frame enclose the main board module and the battery module.

9. The foldable display apparatus according to claim 4, wherein:

the plurality of guide units includes a first guide unit corresponding to a first rotary unit of the first hinge arm and a second guide unit corresponding to a second rotary unit of the second hinge arm, and the first rotary unit and the second rotary unit rotate around a pair of different rotary axes defined by the first guide unit and the second guide unit, respectively.

10. The foldable display apparatus of claim 1, wherein the arm cover is a single integrated structure including the first guide unit and the second guide unit.

11. A foldable display apparatus, comprising:

a first frame and a second frame;

a display panel connected to the first frame and the second frame; and a hinge assembly rotatably connecting the first frame and the second frame to fold or unfold the display panel, the hinge assembly including:

a first hinge arm coupled to the first frame;

a second hinge arm coupled to the second frame;

a hinge housing below and accommodating the first hinge arm and the second hinge arm; and an arm cover above the first hinge arm and the second hinge arm and fastened to the hinge housing, the arm cover including a first recessed guide corresponding to the first hinge arm and a second recessed guide corresponding to the second hinge arm, wherein each of the first recessed guide and the second recessed guide has a shape recessed from a lower surface of the arm cover in an upward direction to accommodate at least a part of a corresponding one of the first and second hinge arms in the recessed shape and contact an upper surface of the corresponding one of the first and second hinge arms, wherein a lower surface of each of the first recessed guide and the second recessed guide has an arc shape and faces toward the hinge housing, the arc shape being convex in a downward direction, wherein both ends of each of the first and second hinge arms are configured to rotate upwardly in a folding movement, such that the hinge assembly is configured to fold the display panel inwardly so that the display panel is positioned in an interior of the foldable display apparatus in a folded state, and wherein each of the first recessed guide and the second recessed guide of the arm cover includes a step portion to stop the corresponding one of the first and second hinge arms from rotating to fold the display panel outwardly.

12. The foldable display apparatus of claim 11, wherein:

a portion of the first hinge arm is accommodated in the recessed shape of the first recessed guide, and a portion of the second hinge arm is accommodated in the recessed shape of the second recessed guide, and the first recessed guide and the second recessed guide each has an arc shape.

13. The foldable display apparatus of claim 12, wherein each of the first hinge arm and the second hinge arm includes:

a fixing unit coupled to a corresponding one of the first frame and the second frame; and a rotary unit having a curved shape to rotatably move along the recessed shape of a corresponding one of the first recessed guide and the second recessed guide of the arm cover.

14. The foldable display apparatus of claim 13, wherein:

the curved shape of the rotary unit corresponds with the arc shape of the corresponding one of the first recessed guide and the second recessed guide of the arm cover, and the rotary unit of the first hinge arm rotates with respect to a rotary axis different from a rotary axis with respect to which the rotary unit of the second hinge arm rotates.

15. The foldable display apparatus of claim 11, further comprising:

a first cover and a second cover disposed below the display panel, wherein the first frame and the second frame respectively include a first inner frame enclosing an inner side of the first cover and a second inner frame enclosing an inner side of the second cover, and wherein the first inner frame and the second inner frame are in contact with each other in an unfolded state of the foldable display apparatus.

16. The foldable display apparatus of claim 15, wherein:

the first inner frame includes a first curved surface adjacent to the second inner frame, the second inner frame includes a second curved surface adjacent to the first inner frame, in the unfolded state of the foldable display apparatus, the first curved surface and the second curved surface form an accommodation space, and the hinge assembly is disposed in the accommodation space.

17. The foldable display apparatus of claim 15, wherein:

the first frame includes a first fastening unit formed in the first inner frame, the second frame includes a second fastening unit formed in the second inner frame, and the first fastening unit is coupled to a first fixing unit of the first hinge arm, and the second fastening unit is coupled to a second fixing unit of the second hinge arm.

18. The foldable display apparatus of claim 15, further comprising:

a main board module and a battery module disposed on the first cover and the second cover, respectively;

a first mid frame and a second mid frame disposed on the main board module and the battery module, respectively; and a first bezel cover and a second bezel cover covering an upper edge of the display panel, wherein the first frame and the second frame enclose the main board module and the battery module.

19. The foldable display apparatus of claim 11, wherein the hinge housing includes a fixing member, and wherein the arm cover is fastened with the hinge housing by the fixing member and a fixing groove formed on the arm cover.

20. The foldable display apparatus of claim 11, wherein the arm cover is a single integrated structure including the first recessed guide and the second recessed guide.

\* \* \* \* \*